(12) United States Patent
Kang et al.

(10) Patent No.: US 11,740,737 B2
(45) Date of Patent: Aug. 29, 2023

(54) TOUCH DISPLAY DEVICE, TOUCH DRIVING CIRCUIT AND TOUCH DRIVING METHOD THEREOF

(71) Applicant: LG Display Co., Ltd., Seoul (KR)

(72) Inventors: Seongkyu Kang, Paju-si (KR); SungChul Kim, Paju-si (KR); HoonBae Kim, Seoul (KR); SunYeop Kim, Seoul (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 17/507,631

(22) Filed: Oct. 21, 2021

(65) Prior Publication Data

US 2022/0197474 A1 Jun. 23, 2022

(30) Foreign Application Priority Data

Dec. 23, 2020 (KR) .................... 10-2020-0182548

(51) Int. Cl.
  *G06F 3/041*  (2006.01)
  *G06F 3/044*  (2006.01)
  *G09G 3/20*   (2006.01)

(52) U.S. Cl.
  CPC ........ *G06F 3/04184* (2019.05); *G06F 3/0412* (2013.01); *G06F 3/0448* (2019.05); *G06F 3/04166* (2019.05); *G09G 3/20* (2013.01); *G09G 2310/0291* (2013.01); *G09G 2310/0297* (2013.01); *G09G 2310/08* (2013.01)

(58) Field of Classification Search
  CPC ............... G06F 3/04184; G06F 3/0412; G06F 3/04166; G06F 3/0448; G06F 3/04164; G06F 3/0553; G06F 3/0446; G06F 3/0445; G06F 3/0418; G09G 3/20; G09G 3/3655; G09G 2310/0291; G09G 2310/0297; G09G 2354/00; H01L 27/323
  See application file for complete search history.

(56) References Cited

U.S. PATENT DOCUMENTS

| | | | | |
|---|---|---|---|---|
| 9,223,425 | B1 * | 12/2015 | Kim | G06F 3/04166 |
| 2002/0063703 | A1 * | 5/2002 | Furuhashi | G09G 3/3696 |
| | | | | 345/212 |
| 2013/0241873 | A1 * | 9/2013 | Kim | G02F 1/13338 |
| | | | | 345/173 |

(Continued)

*Primary Examiner* — David Tung
(74) *Attorney, Agent, or Firm* — Fenwick & West LLP

(57) ABSTRACT

Embodiments of the present disclosure relate to a touch display device, a touch driving circuit and a touch driving method thereof, and more particularly, a touch display device, a touch driving circuit and a touch driving method thereof enabling to reduce the distortion phenomenon of the common voltage caused by a load of the touch electrodes. In addition, embodiments of the present disclosure relate to a touch display device, a touch driving circuit and touch driving method thereof enabling reduction of the distortion phenomenon of the common voltage according to a structure of the touch electrodes. In addition, embodiments of the present disclosure relate to a touch display device, a touch driving circuit and touch driving method thereof enabling to reduce the distortion phenomenon of the common voltage generated in a driving process in which a display driving operation and a touch driving operation are alternated.

24 Claims, 15 Drawing Sheets

(56) References Cited

U.S. PATENT DOCUMENTS

2014/0092077 A1* 4/2014 Kim ................... G09G 3/3611
                                                    345/212
2016/0334934 A1* 11/2016 Mo .................... G06F 3/04166
2017/0242529 A1* 8/2017 Park ........................ G09G 3/20
2018/0188865 A1* 7/2018 Jang ................... H03F 3/45179
2019/0050093 A1* 2/2019 Li ........................ G06F 3/0412

* cited by examiner

TOUCH DISPLAY DEVICE, TOUCH DRIVING CIRCUIT AND TOUCH DRIVING METHOD THEREOF

CROSS REFERENCE TO RELATED APPLICATION

This application claims priority from Republic of Korea Patent Application No. 10-2020-0182548, filed on Dec. 23, 2020, which is hereby incorporated by reference in its entirety.

TECHNICAL FIELD

Embodiments relate to a touch display device, a touch driving circuit and a touch driving method thereof.

DESCRIPTION OF RELATED ART

With the development of multimedia, the importance of flat panel display devices is increasing. In response to this, flat panel display devices such as a liquid crystal display (LCD), a plasma display panel (PDP), and an organic light emitting display (OLED) are commercially available.

In addition, a touch display device, in which a touch panel is stacked on such a display device, that generates information corresponding to a touch point from a sense of the touch point or performs a calculation about a touch operation is widely used by using a feature that electrical characteristics such as resistance or capacitance change at the touch point where a hand or a stylus pen comes into contact.

Such a touch display device is one of user interfaces, and its application is expanding to small portable terminals, office devices, mobile devices, and the like.

However, when the touch panel is separately stacked on the touch display device, the display device becomes thicker. Thus, there is a limitation in manufacturing the touch display device to be thin, a light transmission efficiency decreases by passing through the laminated touch panel, and a manufacturing cost increases. In order to solve such problems, recently, an advanced in-cell touch (AIT) type display device in which touch electrodes are embedded in pixel area of the display panel has been proposed.

Meanwhile, the load of the touch electrode disposed in the display panel increases as the size and resolution of the touch display device increase. Accordingly, it may cause an error in the image displayed on the display panel due to a distortion phenomenon of the common voltage supplied to the touch electrode.

SUMMARY

Embodiments may provide a touch display device, a touch driving circuit and touch driving method thereof enabling to reduce the distortion phenomenon of the common voltage caused by a load of the touch electrodes.

In addition, embodiments may provide a touch display device, a touch driving circuit and touch driving method thereof enabling the reduction of the distortion phenomenon of the common voltage according to a structure of the touch electrodes.

In addition, embodiments may provide a touch display device, a touch driving circuit and touch driving method thereof enabling to reduce the distortion phenomenon of the common voltage generated in a driving process in which a display driving operation and a touch driving operation are alternated.

According to an aspect, embodiments may provide a touch display device comprising: a display panel including a plurality of touch electrodes; a display driving circuit supplying scan signals to the display panel through a plurality of gate lines; and a touch driving circuit performing a touch sensing operation according to capacitance variations of the plurality of the touch electrodes, and supplying at least one of compensated common voltages which are based upon structures and shapes of the plurality of touch electrodes to the display panel in order to counterbalance a distortion of a common voltage during an overlapping period of the scan signals and/or a transition period between a display driving period and a touch driving period.

According to an aspect, the plurality of touch electrodes are split type touch electrodes separated from each other at the equal intervals.

According to an aspect, the plurality of touch electrodes are woven type touch electrodes in which a plurality of long touch electrodes with long length and a plurality of short touch electrodes with short length in a first direction are alternately arranged in a second direction, and the plurality of short touch electrodes arranged in the second direction are connected to a same touch line.

According to an aspect, the at least one of compensated common voltages have different waveform supplied to the long touch electrodes and the short touch electrodes.

According to an aspect, the at least one of compensated common voltages are pulse signals with a first level selected in a high level section higher than an average level of the distorted common voltage, a second level corresponding to the average level of the distorted common voltage, and a third level selected in a low level section lower than the average level of the distorted common voltage in a case of counterbalancing the distortion of the common voltage during an overlapping period of the scan signals.

According to an aspect, the at least one of compensated common voltages are single-level signals with a constant level in a case of counterbalancing the distortion of the common voltage during a transition period.

According to an aspect, the at least one of compensated common voltages are supplied during the display driving period before entering the touch driving period, and during the display driving period after the touch driving period ends.

According to an aspect, embodiments may provide the touch display device further comprising: a compensated common voltage generation circuit including a first multiplexer receiving a first level voltage and a second level voltage as input signals, and selecting an output signal according to a first control signal; a second multiplexer receiving the output signal of the first multiplexer and a third level voltage as input signals and selecting an output signal according to a second control signal; and a buffer circuit receiving the output signal of the second multiplexer and transmitting the at least one of compensated common voltages.

According to an aspect, embodiments may provide the touch display device further comprising: a compensated common voltage generation circuit including a multiplexer receiving a first level voltage, a second level voltage and a third level voltage as input signals, and selecting an output signal according to a first control signal and a second control signal; and a buffer circuit receiving the output signal of the multiplexer and transmitting the at least one of compensated common voltages.

According to an aspect, embodiments may provide the touch display device further comprising: a plurality of common voltage compensation lines arranged in parallel with a plurality of touch lines transmitting touch signals to the plurality of touch electrodes, and configured to supply the at least one of compensated common voltage to the plurality of touch electrodes.

According to another aspect, embodiments may provide a touch driving circuit including: a plurality of touch lines transmitting touch signals to a display panel including a plurality of touch electrodes; a touch sensing circuit supplying touch driving signals to the plurality of touch electrodes through the plurality of touch lines and receiving touch sensing signals from the plurality of touch electrodes; a touch controller detecting touch presence according to the touch sensing signals and calculating touch coordinates; and a compensated common voltage generation circuit configured to generate at least one of compensated common voltage to be supplied to the display panel according to structures and shapes of the plurality of touch electrodes for counterbalancing distortion of common voltage during an overlapping period of scan signals supplied to the display panel and/or during a transition period between a display driving period and a touch driving period.

According to another aspect, embodiments may provide a touch driving method for a touch display device including a display driving circuit supplying scan signals to a display panel with a plurality of touch electrodes, and a touch driving circuit supplying touch driving signals to the display panel and sensing touches based on touch sensing signals received in response to the touch driving signals, the touch driving method comprising: detecting an overlap distortion of a common voltage during an overlapping period of the scan signals; detecting a transition distortion of a common voltage during a transition period between a display driving period and a touch driving period; generating at least one of compensated common voltages for counterbalancing the overlap distortion of a common voltage and/or the transition distortion of a common voltage according to structures and shapes of the plurality of touch electrodes; and supplying the at least one of compensated common voltages to corresponding touch electrodes during an overlapping period of the scan signals and/or during a transition period between the display driving period and the touch driving period.

In according to exemplary embodiments, it may provide a touch display device, a touch driving circuit and touch driving method thereof enabling to reduce the distortion phenomenon of the common voltage caused by a load of the touch electrodes.

In according to exemplary embodiments, it may provide a touch display device, a touch driving circuit and touch driving method thereof enabling the reduction of the distortion phenomenon of the common voltage according to a structure of the touch electrodes.

In according to exemplary embodiments, it may provide a touch display device, a touch driving circuit and touch driving method thereof enabling to reduce the distortion phenomenon of the common voltage generated in a driving process in which a display driving operation and a touch driving operation are alternated.

BRIEF DESCRIPTION OF THE DRAWINGS

The above and other objects, features, and advantages of the present disclosure will be more clearly understood from the following detailed description, taken in conjunction with the accompanying drawings, in which.

DETAILED DESCRIPTION

Figure 1:
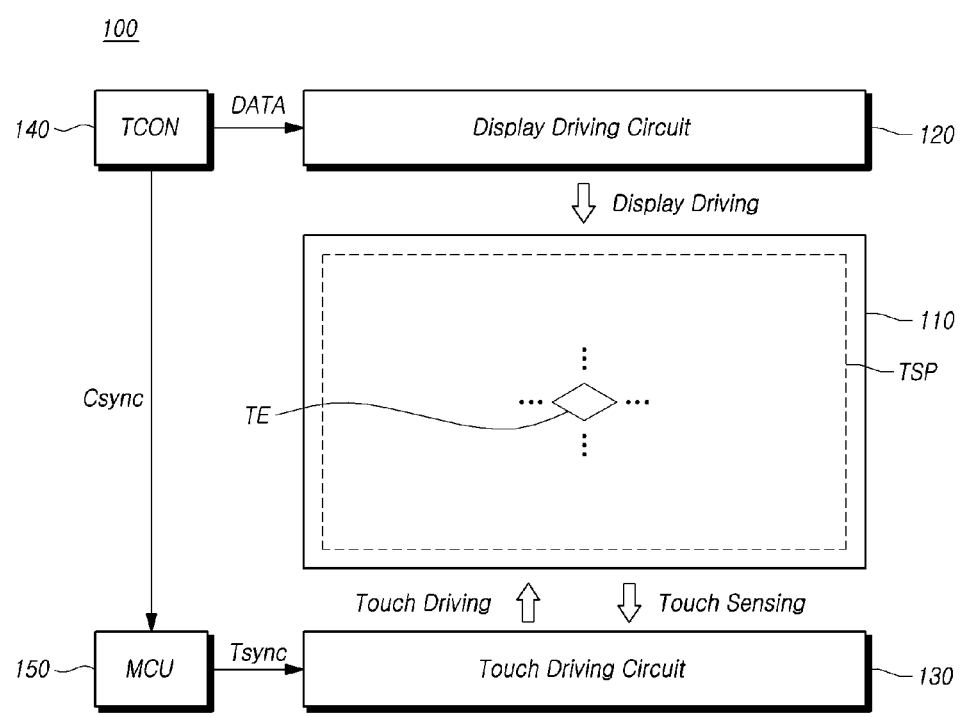
FIG. 1 illustrates schematically a diagram of a touch display device according to embodiments.

In the following description of examples or embodiments of the present invention, reference will be made to the accompanying drawings in which it is shown by way of illustration specific examples or embodiments that can be implemented, and in which the same reference numerals and signs can be used to designate the same or like components even when they are shown in different accompanying drawings from one another. Further, in the following description of examples or embodiments of the present invention, detailed descriptions of well-known functions and components incorporated herein will be omitted when it is determined that the description may make the subject matter in some embodiments of the present invention rather unclear. The terms such as "including", "having", "containing", "constituting" "make up of", and "formed of" used herein are generally intended to allow other components to be added unless the terms are used with the term "only". As used herein, singular forms are intended to include plural forms unless the context clearly indicates otherwise.

Terms, such as "first", "second", "A", "B", "(A)", or "(B)" may be used herein to describe elements of the present invention. Each of these terms is not used to define essence, order, sequence, or number of elements etc., but is used merely to distinguish the corresponding element from other elements.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

When time relative terms, such as "after", "subsequent to", "next", "before", and the like, are used to describe processes or operations of elements or configurations, or flows or steps in operating, processing, manufacturing methods, these terms may be used to describe non-consecutive or non-sequential processes or operations unless the term "directly" or "immediately" is used together.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompass all the meanings of the term "can".

FIG. 1 illustrates schematically a diagram of a touch display device according to embodiments.

Referring to FIG. 1, the touch display device 100 according to embodiments may have a function of displaying images and a function of sensing a touch from a user.

In order to implement both a function of displaying the images and a function of sensing a touch, the touch display device 100 may include a display panel 110 in which a plurality of data lines and a plurality of gate lines are arranged, a display driving circuit 120 for driving the display panel 110, and the like.

In terms of functionality, the display driving circuit 120 may include a data driving circuit for driving the data lines, a gate driving circuit for driving the gate lines, and a controller for controlling the data driving circuit and the gate driving circuit. The display driving circuit 120 may be implemented as one or more integrated circuits.

The touch display device 100 may include a touch screen panel TSP in which a plurality of touch electrodes TE for sensing touches are arranged, and a touch driving circuit 130 for driving the touch screen panel TSP and processing signals related to touches.

The touch screen panel TSP in the touch display device 100 may be an external type in which the touch screen panel TSP is manufactured separately from the display panel 110 and thereafter bonded with the display panel 110, or an embedded type in which the touch screen panel TSP is manufactured together with the display panel 110 and located inside of the display panel 110.

Thus, the touch screen panel TSP in the touch display device 100 according to embodiments may be an independent panel having a function of sensing a touch, or a display panel 110 having a function of displaying together with the function of sensing a touch. Hereinafter, for convenience of description, it is assumed that the display panel 110 includes the touch screen panel TSP.

The touch driving circuit 130 may provide a touch driving signal to the display panel 110 for driving the display panel 110, receive a touch sensing signal from the display panel 110, and detect a touch presence or a touch coordinate based on the touch sensing signal.

The touch driving circuit 130 may include a touch sensing circuit for providing the touch driving signal and receiving the touch sensing signal, and a touch controller for detecting the touch presence or calculating the touch coordinate.

The touch driving circuit 130 may be implemented as one or more components like integrated circuits, or implemented separately from the display driving circuit 120.

Further, all or at least a part of the touch driving circuit 130 may be implemented by being integrated with the display driving circuit 120 or an inner circuit of the display driving circuit 120. For example, the touch sensing circuit of the touch driving circuit 130 may be implemented as an integrated circuit with the data driving circuit of the display driving circuit 120.

In addition, the touch display device 100 may include a micro control unit 150 that controls the touch driving circuit 130.

The micro control unit 150 may generate a touch synchronization signal Tsync that controls the touch driving circuit 130 based on a control synchronization signal Csync received from the timing controller (TCON) 140. The micro control unit 150 supplies and receives touch signals based on a defined interface with the touch driving circuit 130

Here, the micro control unit 150 may be formed in an integrated circuit together with the touch controller in the touch driving circuit 130, or may be formed in an integrated circuit together with the timing controller 140.

In addition, the touch display device 100 may include the timing controller 140 that controls the display driving circuit 120 and the micro control unit 150.

The timing controller 140 receives timing signals such as a vertical synchronization signal, a horizontal synchronization signal, a data enable signal, and a main clock, and a digital image data DATA from a host system (not shown).

The timing controller 140 controls the scan timing of the display driving circuit 120 based on scan timing control signals including a gate start pulse, a gate shift clock, and a gate output enable signal. In addition, the timing controller 140 controls the data timing of the display driving circuit 120 based on data timing control signals including a source sampling clock and a source output enable signal.

Meanwhile, the touch display device 100 may sense the touch presence or the touch coordinate based on capacitance formed by touch electrodes TE.

The touch display device 100 may sense a touch by a mutual-capacitance scheme or a self-capacitance scheme, as a capacitance based touch sensing scheme.

In case of a touch sensing scheme based on mutual-capacitance, a plurality of touch electrodes TE may be classified as touch driving electrodes which is supplied touch driving signals through touch driving lines, and touch sensing electrodes which forms capacitances with the touch driving electrodes and supplies touch sensing signals through touch sensing lines. Here, the touch driving lines and the touch sensing lines may be referred to as touch lines.

In case of the touch sensing scheme based on mutual-capacitance, the touch presence and the touch coordinate may be detected based on a change of mutual-capacitance formed between the touch driving electrode and the touch sensing electrode according to a presence of a pointer such as a finger, a pen, or the like.

In case of the touch sensing scheme based on self-capacitance, each touch electrode TE serves as both the touch driving electrode and the touch sensing electrode. That is, a touch driving signal is supplied to a touch electrode TE through a touch line, and a touch sensing signal generated in the touch electrode TE, to which the touch driving signal is supplied, is transmitted through the same touch line. Accordingly, in case of the touch sensing scheme based on self-capacitance, there is no distinction between the touch driving electrode and the touch sensing electrode and no distinction between the touch driving line and the touch sensing line.

In case of the touch sensing scheme based on self-capacitance, the touch presence and a touch coordinate may be detected based on a change in capacitance formed between a pointer such as a finger, a pen, or the like, and a touch electrode TE.

Thus, the touch display device 100 may sense a touch by the touch sensing scheme based on mutual-capacitance or the touch sensing scheme based on self-capacitance.

Further, such a touch display device 100 may be various types of display devices, such as a liquid crystal display device, an organic light emitting display device, a plasma display panel, a quantum dot display device, and the like.

For example, when the touch display device 100 according to embodiments is a liquid crystal display device, a plurality of touch electrodes TE may be arranged on the display panel 110, and may be common electrodes to which a common voltage for displaying images is applied.

In another example, when the touch display device 100 is the organic light emitting display device, the touch display device 100 may include an organic light emitting diode composed of a first electrode (anode electrode), an organic light emitting layer, and a second electrode (cathode electrode), an encapsulation layer located on the second electrode and having an encapsulating function, and a touch sensor metal layer located on the encapsulation layer. Here, a plurality of touch electrodes TE may be formed on the touch sensor metal layer, or may be formed on the second electrode constituting the cathode electrode of the organic light emitting diode.

Meanwhile, a common voltage supplied to the common electrode or the touch electrode TE may be a direct voltage with a specific voltage level for a predetermined time when the level of the data voltage supplied to the display panel 110 is changed within the display driving period.

Figure 2:
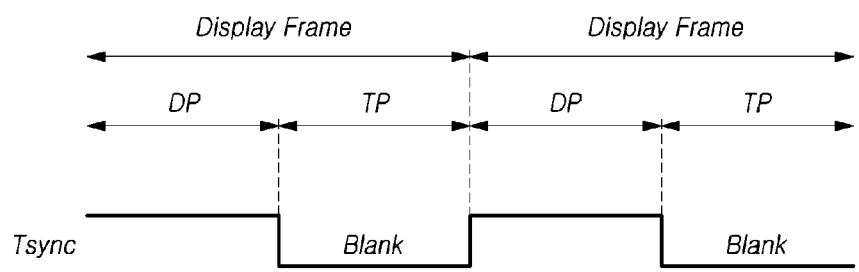
FIG. 2 illustrates timings for configuring a display driving period and a touch driving period in the touch display device according to embodiments of the present disclosure.

FIG. 2 illustrates timings for configuring a display driving period and a touch driving period in the touch display device according to embodiments of the present disclosure.

Referring to FIG. 2, touch display device 100 according to embodiments of the present disclosure performs display driving for displaying images during the predefined display driving period DP, and performs touch driving for sensing a touch input from a finger or a stylus during the predefined touch driving period TP within a display frame period.

The touch display device 100 uses a common electrode for driving each pixel as an electrode for sensing a touch. Accordingly, a common voltage is provided to a thin film transistor connected to the common electrode during the display driving period DP, and a touch driving signal is provided to the common electrode acting as a touch electrode during the touch driving period TP.

The display driving period DP and the touch driving period TP may be equal in time, all or partly overlap with each other in time, or be separated from each other in time.

A driving method in which the display driving period DP and the touch driving period TP be separated from each other in time may be referred to as time division driving.

When the display driving period DP and the touch driving period TP are equal in time, the display driving operation and the touch driving operation may be performed simultaneously. This driving method is may be referred to as time free driving operation.

In the time division driving, the display driving period DP and the touch driving period TP may be alternately arranged.

Thus, when the display driving period DP and the touch driving period TP are separated in time while alternately being arranged, the touch driving period TP may correspond to a blank period Blank in which the display driving operation is not performed.

The touch display device 100 may generate a touch synchronization signal Tsync swung between a high level and a low level that is less than the high level, and through this, may identify or control the display driving period DP and the touch driving period TP. That is, the touch synchronization signal Tsync may be a driving timing control signal for defining the touch driving period TP.

For example, a high level period (or a low level period) of the touch synchronization signal Tsync may correspond to the display driving period DP, and the low level period (or the high level period) of the touch synchronization signal Tsync may correspond to the touch driving period TP.

In this case, the touch driving circuit 130 may supply the touch driving signal to the touch electrode TE in the touch driving period TP where the touch synchronization signal is at the low level, and may sense the touch presence and touch position of the passive stylus or the active stylus using a touch sensing signal received from the touch electrode TE.

Meanwhile, with respect to methods of assigning the display driving period DP and the touch driving period TP in one display frame period, for example, one display frame period may be divided into one display driving period DP and one touch driving period TP, and display driving operation may be performed during one display driving period DP, and touch driving operation for sensing a touch input from a finger and a stylus may be performed during one touch driving period TP corresponding to a blank period Blank.

The touch display device 100 performs the touch driving operation once during a screen refresh period or a display frame period corresponding to a frame frequency.

For example, when the frame frequency is 60 Hz, display driving operation is performed to turn on or turn off pixels through N gate lines constituting the display panel 110 within a horizontal period of 1/60 second. After that, a touch driving period TP for touch sensing operation is performed for a predetermined interval. In this case, the touch report rate will be 60 Hz.

In another example, one display frame period may be divided into two or more display driving periods DP and two or more touch driving periods TP, and display driving operation may be performed during two or more display driving periods DP in one display frame period, and touch driving operation for sensing once or two or more times a touch input from a finger and a stylus on all or at least a part of a display screen may be performed during two or more touch driving periods TP in one display frame period.

Like this, when dividing one display frame period into two or more display driving periods DP and two or more touch driving periods TP, and then performing the display driving operation and the touch driving operation, each of two or more blank periods corresponding to two or more touch driving periods TP in one display frame period is sometimes referred to as a long horizontal blank ("LHB").

Accordingly, two or more periods in which the sensing of a touch from a stylus or a finger is performed in a display frame period may be referred to as LHBs or touch driving periods TP, and touch driving operation performed during two or more LHBs in one touch frame period is referred to as "LHB driving operation".

Figure 3:
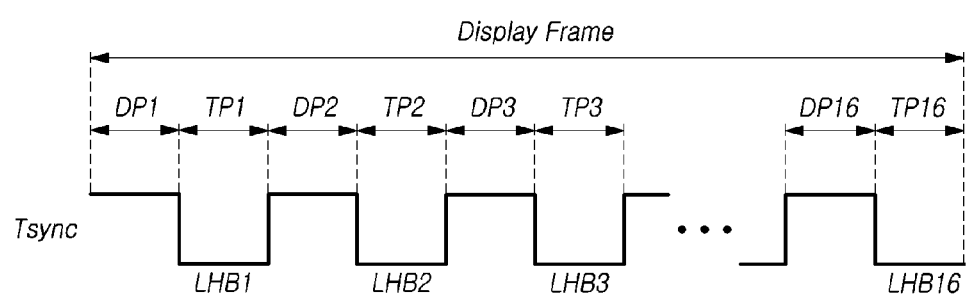
FIG. 3 illustrates a timing signal of a long horizontal blank (LHB) driving operation in a touch display device according to embodiments of the present disclosure.

FIG. 3 illustrates a timing signal of a LHB driving operation in a touch display device according to embodiments of the present disclosure.

Referring to FIG. 3, in the touch display device 100 according to embodiments of the present disclosure, one display frame period may be time divided into 16 display driving periods DP1-DP16 and 16 touch driving periods TP1-TP16. However, different numbers of display driving periods and touch driving periods may be used in other embodiments.

In this case, the 16 touch driving periods TP1-TP16 may correspond to 16 long horizontal blanks LHB1-LHB16.

In this case, the touch display device 100 divides one display frame period into more display driving periods DP1-DP16 and more touch driving periods TP1-TP16, and performs alternately the display driving operation and the touch driving operation.

Alternatively, the touch driving periods TP1-TP16 may proceed independently from the display driving periods DP1-DP16.

Figure 4:
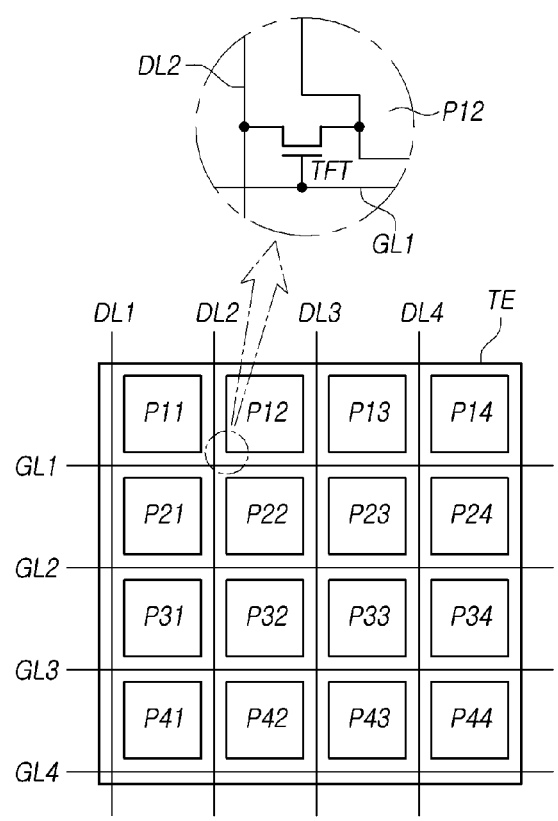
FIG. 4 illustrates a part of a touch electrode area in a touch display device according to embodiments of the present disclosure.

FIG. 4 illustrates a part of a touch electrode area in a touch display device according to embodiments of the present disclosure.

Referring to FIG. 4, the touch display device 100 according to embodiments of the present disclosure includes a plurality of thin film transistors TFT formed on a substrate, a plurality of pixel electrodes P11-P44 connected to a drain node or a source node of the plurality of thin film transistors TFT, and a touch electrode TE formed to overlap the plurality of pixel electrodes P11-P44 to form an electric field.

A gate node of the thin film transistor TFT is connected to a gate line to be controlled on-off according to a scan signal, and a source node or a drain node is connected to a data line DL to which a data voltage is supplied.

At this time, when a passive stylus such as a finger or an active stylus is touched on the display panel 110, the touch display device 100 may recognize a change in capacitance of the touch electrode TE close to the contact position of the stylus and detect a touch position. That is, the touch display device 100 may supply a touch driving signal to the touch electrodes TE formed on the display panel 110, and then may sense a touch position by detecting a touch sensing signal received from the touch electrodes TE and detecting a change in capacitance of each of the touch electrodes TE.

At this time, a common voltage or a touch driving signal is supplied to the touch electrode TE of the touch display device 100, and thus, a parasitic capacitance coupled to the touch electrode TE may be generated. For example, parasitic capacitance may be generated between the gate line and the touch electrode TE by a scan signal supplied to the display panel 110 through the gate line. Due to this parasitic capacitance, a load on the touch electrode TE increases, distortion occurs in the common voltage supplied to the touch electrode TE, and a defective line may appear on the display panel 110.

Figure 5:
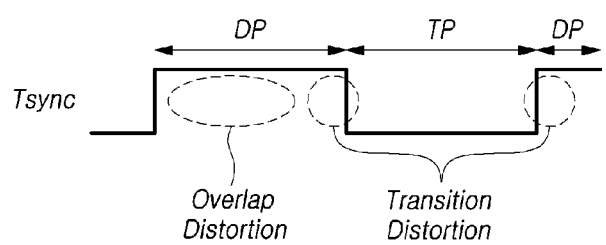
FIG. 5 illustrates a diagram of distortion of a common voltage occurring between a gate line and a touch electrode according to a driving period in a touch display device according to embodiments of the present disclosure.

FIG. 5 illustrates a diagram of distortion of a common voltage occurring between a gate line and a touch electrode according to a driving period in a touch display device according to embodiments of the present disclosure.

Referring to FIG. 5, the touch display device 100 according to embodiments of the present disclosure may perform a display driving operation for displaying an image during a display driving period DP determined within one display frame period and perform a touch driving operation for sensing a touch input by a finger or a stylus during a predetermined touch driving period TP.

In this case, the touch electrodes TE for detecting touch may be used as a common electrode for driving each pixel. Accordingly, a common voltage may be supplied to the touch electrode (common electrode) during the display driving period DP, and a touch driving signal may be supplied to the touch electrode (common electrode) during the touch driving period TP.

In this case, the scan signals supplied through the gate lines may overlap in a predetermined period within the display driving period DP. It may accumulate parasitic capacitance formed between a gate node of the thin film transistor and the touch electrode (common electrode). Such parasitic capacitance may increase the load on the touch electrode (common electrode), and may cause a defect such as a horizontal line due to a difference in luminance by distortion of the common voltage. As described above, the defect caused by the overlap of the scan signals may be called overlap distortion.

On the other hand, such overlap distortion may appear in the display driving period DP. But, in the case of time free driving in which display driving operation and touch driving operation are performed at the same time, it may appear in the touch driving period TP since scan signals are supplied during the touch driving period TP. However, since a common voltage of a DC level is supplied during the display driving period DP and a pulse type common voltage (touch driving signal) is supplied during the touch driving period TP, the distortion of the common voltage may be changed.

Figure 6:
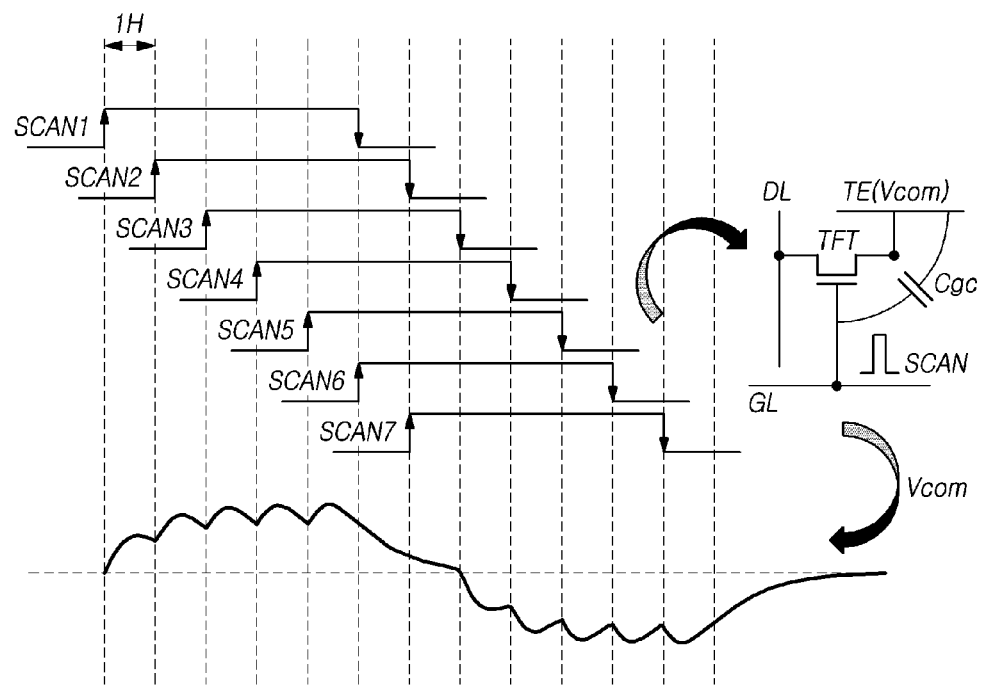
FIG. 6 illustrates a schematic diagram showing an overlap distortion phenomenon caused by overlap of scan signals during a display driving period in a touch display device according to embodiments of the present disclosure.

FIG. 6 illustrates a schematic diagram showing an overlap distortion phenomenon caused by overlap of scan signals during a display driving period in a touch display device according to embodiments of the present disclosure.

Referring to FIG. 6, the touch display device 100 according to embodiments of the present disclosure may sequentially supply the scan signals SCAN to the display panel 110 through the gate lines at an interval of one horizontal period 1H.

In this case, the scan signals SCAN may maintain a high level for a certain period. Here, FIG. 6 illustrates a case that the scan signals SCAN have a high level period of 5 horizontal periods 5H as an example.

As described above, when the scan signals SCAN with a predetermined high level period transmitted to the display panel 110 through the gate lines GL are supplied at intervals of one horizontal period 1H, an overlapping period is generated between the adjacent scan signals SCAN. A parasitic capacitance Cgc may be generated between the gate line GL and the touch electrode TE by the overlapping period of the scan signals SCAN. In other words, a parasitic capacitance Cgc may be accumulated between the gate node of the thin film transistor TFT and the touch electrode TE to which the common voltage Vcom is supplied, and the common voltage Vcom may be distorted by the increase of a load on the touch electrode TE.

Also, the operation of the gate driving circuit may be temporarily stopped in the process of entering the touch driving period TP from the display driving period DP. The operation of the gate driving circuit may be restarted at starting point of the display driving period DP after the touch driving period TP ends. As described above, distortion of a common voltage may occur in some gate lines in a period which the gate driving circuit operates discontinuously. Accordingly, it may cause defects such as horizontal lines by a luminance difference. As described above, a defect generated in the transition process between the display driving period and the touch driving period may be referred to as transition distortion.

The distortion of the common voltage Vcom may be changed depending on the shape of the touch electrode TE to which the touch signal is supplied.

In this case, a size of the touch electrode TE disposed on the display panel 110 may correspond to a size of one subpixel or a size of two or more subpixels. In addition, each touch electrode TE may be a plate type without openings or a mesh type with one or more openings.

If one touch electrode TE is a mesh type and has a size corresponding to a size of two or more subpixels, one touch electrode TE has two or more openings, and a position and a size of each of the two or more openings may correspond to a position and a size of the light emitting area of the subpixel.

In this case, the display panel 110 may be a split type in which each of the plurality of touch electrodes TE with a same size is separated from each other, or a woven type in which touch electrodes TE with different sizes are arranged in adjacent rows or columns The touch display device 100 of the present disclosure may reduce the defect caused by the distortion of the common voltage Vcom and improve the image quality by generating a compensated common voltage capable of counterbalancing the distortion of the common voltage Vcom according to the structure of the touch electrode TE and supplying it to the corresponding touch electrode TE.

Figure 7:
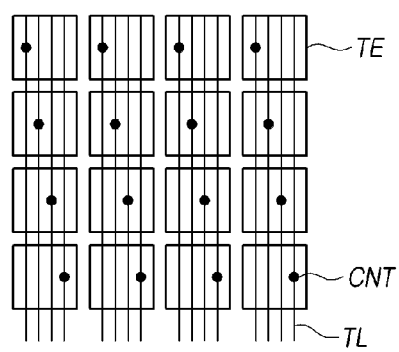
FIG. 7 illustrates a display panel comprised of split type touch electrodes in a touch display device according to embodiments of the present disclosure.

FIG. 7 illustrates a display panel comprised of split type touch electrodes in a touch display device according to embodiments of the present disclosure.

Referring to FIG. 7, when a plurality of split type touch electrodes TE are disposed in the display panel 110 of the touch display device 100 according to embodiments of the present disclosure, each of a plurality of touch electrodes TE may be electrically connected with touch lines TL through one or more contact holes CNT.

The plurality of touch electrodes TE may be positioned in an active area. Depending on cases, some (e.g., outermost touch electrodes) of the plurality of touch electrodes TE may be positioned in an outside area (bezel area) of the active area or may extend to the outside area (bezel area) of the active area. The active area may be an area in which images are displayed or touch sensing process is performed.

A plurality of touch lines TL electrically connected to the plurality of touch electrodes TE may be positioned in an active area. Depending on cases, all or some of the plurality of touch lines TL may be positioned at outside area of the active area. When the plurality of touch lines TL electrically connected to the plurality of touch electrodes TE are positioned in the active area, the plurality of touch lines TL may overlap the plurality of touch electrodes TE by positioning the plurality of touch lines in a layer different from the plurality of touch electrodes TE.

The plurality of touch lines TL all may have the same or similar length and may be disposed from a point connected with the touch driving circuit 130 to the opposite point. The plurality of touch lines TL may be different only in the position (i.e., the position of the contact hole CNT) where they are respectively connected with the corresponding touch electrodes TE.

In a case of a split type display panel 110, if one touch electrode TE is electrically connected with one touch line TL, there should be a plurality of touch lines TL as many as the number of a plurality of touch electrodes TE. That is the number of touch lines TE is equal to the number of touch electrodes TE. The number of the plurality of touch lines TL may correspond to the number of touch channels for signal input and output of the touch driving circuit 130.

Accordingly, in case of a split type display panel 110 composed of 4×4 touch electrodes TE in which 16 touch electrodes TE are arranged in four rows and four columns, 16 touch lines TL and 16 touch channels may exist.

Figure 8:
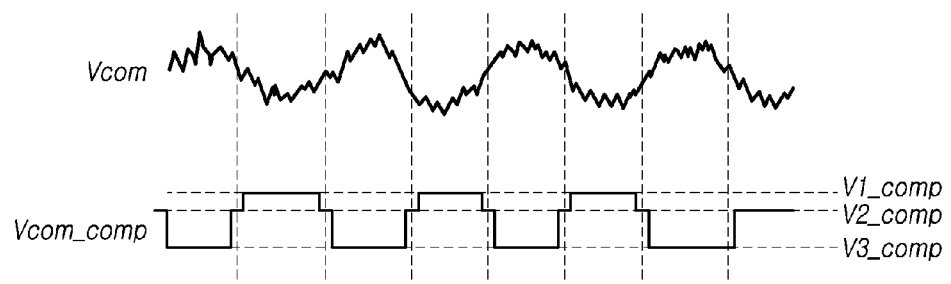
FIG. 8 illustrates a signal waveform of a distortion of a common voltage generated in a split type touch electrodes and a compensated common voltage in a touch display device according to embodiments of the present disclosure.

FIG. 8 illustrates a signal waveform of a distortion of a common voltage generated in a split type touch electrodes and a compensated common voltage in a touch display device according to embodiments of the present disclosure.

Referring to FIG. 8, the split type touch electrode TE may have the same horizontal and vertical lengths, and each touch electrode TE may be disposed spaced apart at equal intervals in the touch display device 100 according to embodiments of the present disclosure.

In this case, even if a distortion of the common voltage Vcom due to the parasitic capacitance Cgc formed between the gate node of the thin film transistor TFT supplied with the scan signal and the touch electrode TE to which the common voltage Vcom is supplied may occur due to an overlapping period between adjacent scan signals SCAN, it may appear in a regular shape due to the split type touch electrodes TE arranged in the same size.

Accordingly, it is possible to generate a compensated common voltage Vcom_comp capable of counterbalancing the distortion and to supply the compensated common voltage Vcom_comp to touch electrodes TE in consideration of the distortion waveform of the common voltage Vcom generated by the structure of the split type touch electrodes TE. As a result, it is possible to reduce image defects caused by luminance deviation.

In this case, the compensated common voltage Vcom_comp capable of counterbalancing the distortion of the common voltage Vcom may be formed in a form of a pulse having a plurality of levels. For example, the compensated common voltage Vcom_comp may have a first level voltage V1_comp as the high level, the second level voltage V2_comp as the reference level that is less than the first level voltage V1_comp, and the third level voltage V3_comp as the low level that is less than the second level voltage V2_comp made of pulse waveforms.

Here, the first level voltage V1_comp may be one level among a plurality of voltage levels in a high level section greater than the average level of the distorted common voltage Vcom. The second level voltage V2_comp may be an average level of the distorted common voltage Vcom. The third level voltage V3_comp may be one level among a plurality of voltage levels in a low level section less than the average level of the distorted common voltage Vcom.

At this time, the compensated common voltage Vcom_comp may comprise of the first level voltage V1_comp and the third level voltage V3_comp without the second level voltage V2_comp.

Accordingly, the distortion waveform of the common voltage Vcom may be calculated or detected by determining the size of the split type touch electrodes TE and the driving method for supplying the scan signals SCAN. Therefore, the distortion of the common voltage Vcom may be counterbalanced by supplying the compensated common voltage Vcom_comp corresponding to the distortion waveform of the common voltage Vcom according to the supplying time of the common voltage Vcom.

The touch display device 100 of the present disclosure may be applied to not only a split type in which a plurality of touch electrodes TE are separated from each other, but also a woven type in which touch electrodes TE of different sizes are disposed in adjacent rows or columns.

Figure 9:
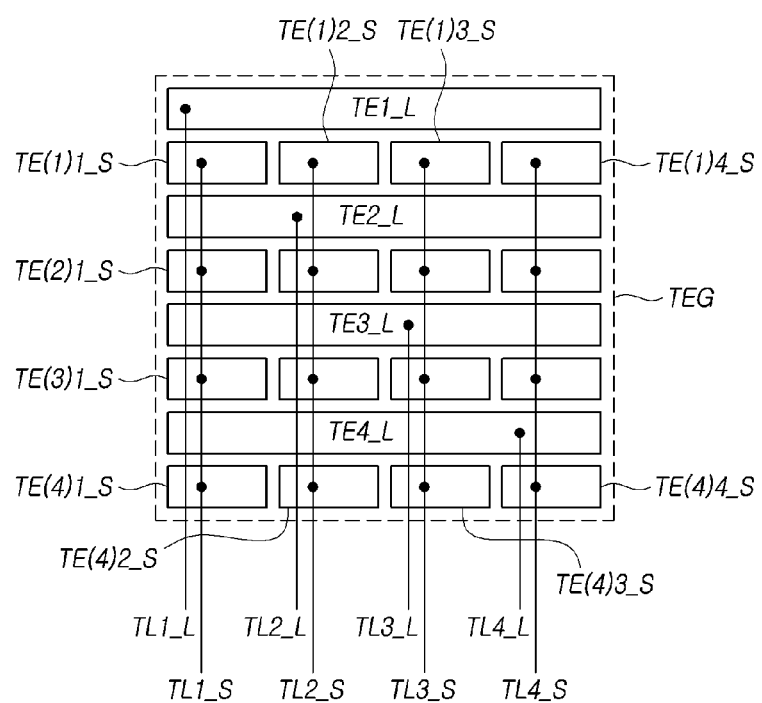
FIG. 9 illustrates a display panel with woven type touch electrodes in a touch display device according to embodiments of the present disclosure.

FIG. 9 illustrates a display panel with woven type touch electrodes in a touch display device according to embodiments of the present disclosure.

Referring to FIG. 9, the woven type display panel 110 of the touch display device 100 according to embodiments of the present disclosure may include a plurality of touch electrode groups TEG comprised of four long touch electrodes TE1_L-TE4_L and four short touch electrode blocks, each of which comprises four short touch electrodes connected by the same line.

In other words, a length of each long touch electrodes TE1_L, TE2_L, TE3L, TE4_L may correspond to a total length of four short touch electrodes e.g., TE(1)1_S, TE(1)2_S, TE(1)3_S, TE(1)4_S in the row direction. In this case, the four short touch electrodes (e.g., TE(1)1_S, TE(2)1_S, TE(3)1_S, TE(4)1_S) in a column direction may be connected to one short touch line (e.g., TL1_S). Therefore, four short touch electrodes arranged in the column direction may constitute one short touch electrode block connected by a same line. Also, four long touch electrodes and four short touch electrode blocks connected by four lines corresponding to them may constitute one touch electrode group TEG.

In the case of the woven type 4×4 touch electrode structure, among two adjacent rows, the number of long touch electrodes in a row where the long touch electrodes are arranged is ¼ of the number of the short touch electrodes in a row where the short touch electrodes are arranged. Accordingly, a length of each of the long touch electrodes TE1_L, TE2_L, TE3_L, TE4_L is approximately four times the length of the short touch electrodes.

In this case, the woven type 4×4 touch electrode structure comprises of four long touch electrodes TE1_L, TE2_L, TE3_L, TE4_L and sixteen short touch electrodes TE(1)1_S, TE(1)2_S, TE(1)3_S, TE(1)4_S-TE(4)1_S, TE(4)2_S, TE(4)3_S, TE(4)4_S, but four short touch electrodes (e.g., TE(1)1_S, TE(2)1_S, TE(3)1_S, TE(4)1_S) in a column direction are connected to one short touch line (e.g., TL1_S).

Therefore, four short touch electrodes (e.g., TE(1)1_S, TE(2)1_S, TE(3)1_S, TE(4)1_S) connected to the short touch line (e.g., Th1_S) constitutes one short touch electrode block connected by the same line, and sixteen short touch electrodes TE(1)1_S, TE(1)2_S, TE(1)3_S, TE(1)4_S-TE(4)1_S, TE(4)2_S, TE(4)3_S, TE(4)4_S constitute four short touch electrode blocks each connected by the same line.

As a result, each of four long touch lines TL1_L, TL2_L, TL3_L, TL4L is connected to each of four long touch electrodes TE1_L, TE2_L, TE3_L, TE4_L, and each of four short touch electrode blocks connected by the same line is connected to each of the short touch lines TL1_S, TL2_S, TL3_S, TL4_S. Therefore, in the case of a woven type 4×4 touch electrode structure, eight touch lines TL1_L, TL2_L, TL3_L, TL4L, TL1_S, TL2_S, TL3_S, TL4_S and eight touch channels are required.

Accordingly, comparing to the split type touch electrode structure, the woven type touch electrode structure has an effect of reducing the number of touch lines and touch channels.

On the other hand, the size of the touch electrode group TEG may be variously changed, but the size of the touch electrode group TEG may be determined in consideration of a distance between finger positions or stylus positions for detecting for multi-touch in order to efficiently arrange the touch electrodes TE on the display panel 110 and increase the accuracy of detection for multi-touch.

On the other hand, a plurality of a woven type touch electrode groups TEG may be disposed in a horizontal direction and a vertical direction in the display panel 110. In this case, each touch electrode group TEG is electrically separated in an active area in which an image is displayed in the display panel 110, but it may be connected to the touch driving circuit 130 through a touch line TL in a non-active area in which an image is not displayed in the display panel 110.

Figure 10:
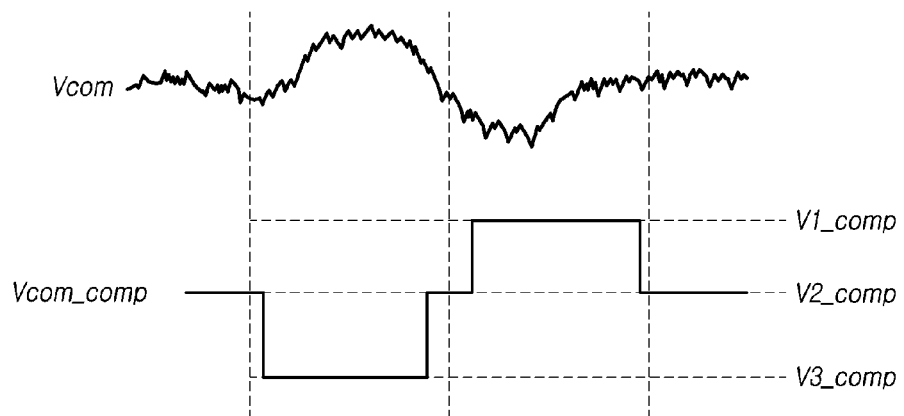
FIG. 10 illustrates a signal waveform showing an example of a distortion of common voltage generated in a woven type long touch electrodes and a compensated common voltage in a touch display device according to embodiments of the present disclosure.
Figure 11:
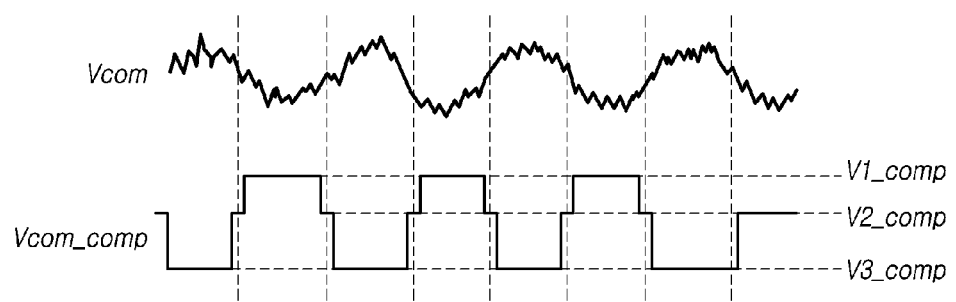
FIG. 11 illustrates a signal waveform showing an example of a distortion of common voltage generated in a woven type short touch electrodes and a compensated common voltage in a touch display device according to embodiments of the present disclosure.

FIG. 10 illustrates a signal waveform showing an example of a distortion of common voltage generated in a woven type long touch electrodes and a compensated common voltage, and FIG. 11 illustrates a signal waveform showing an example of a distortion of common voltage generated in a woven type short touch electrodes and a compensated common voltage in a touch display device according to embodiments of the present disclosure.

Referring to FIGS. 10 and 11, the woven type touch electrodes TE in the touch display device 100 according to embodiments of the present disclosure may be formed of long touch electrodes and short touch electrodes having different lengths.

In this case, since the loads transferred to the long touch electrodes and the short touch electrodes are different, the distortion of the common voltage Vcom due to the parasitic capacitance Cgc formed between the gate node of the thin film transistor TFT to be supplied with the scan signal and the touch electrode TE to which the common voltage Vcom is supplied may be different in the long touch electrodes and the short touch electrodes.

For example, the distortion waveform of the common voltage Vcom may be larger and wider than the short touch electrodes since the length of the long touch electrodes in the woven type 4×4 touch electrode structure is approximately 4 times greater than the length of the short touch electrodes.

On the other hand, the distortion waveform of the common voltage Vcom may be lower and narrower than the long touch electrodes since the length of the short touch electrodes in the woven type 4×4 touch electrode structure is approximately ¼ of the length of the long touch electrodes. However, the distortion waveform of the common voltage Vcom may be different from the split type touch electrode structure since four short touch electrodes arranged in the column direction constitute one short touch electrode block connected by one same line.

Accordingly, the compensated common voltage Vcom_comp capable of counterbalancing the distortion may be generated by independently considering the distortion waveform of the common voltage Vcom in the long touch electrodes and the short touch electrodes of the woven type structure. As a result, display defects due to luminance deviation in the woven type touch electrode structure may be reduced by independently supplying the compensated common voltage Vcom_comp to the long touch electrodes and the short touch electrodes.

In this case, the compensated common voltage Vcom_comp capable of counterbalancing the distortion of the common voltage Vcom may be formed in the form of a pulse signal with a plurality of levels, similar to the split type touch electrode structure. For example, the compensated common voltage Vcom_comp may be composed of pulse waveform with a first level voltage V1_comp as the high level, a second level voltage V2_comp as the reference level, and a third level voltage V3_comp as the low level.

The first level voltage V1_comp may be one level among a plurality of voltage levels in a high level section greater than the average level of the distorted common voltage Vcom. The second level voltage V2_comp may be an average level of the distorted common voltage Vcom. The third level voltage V3_comp may be one level among a plurality of voltage levels in a low level section less than the average level of the distorted common voltage Vcom At this time, the compensated common voltage Vcom_comp may comprise of the first level voltage V1_comp and the third level voltage V3_comp without the second level voltage V2_comp.

Accordingly, the distortion waveform of the common voltage Vcom may be calculated or detected by determining the size of the woven type long touch electrodes, the woven type short touch electrodes and the driving method for supplying the scan signals SCAN. Therefore, the distortion of the common voltage Vcom may be counterbalanced by supplying the compensated common voltage Vcom_comp corresponding to the distortion waveform of the common voltage Vcom according to the supplying time of the common voltage Vcom.

In addition, the touch display device 100 of the present disclosure may supply the compensated common voltage for counterbalancing the distortion of the common voltage in a transition period between the display driving period and the touch driving period.

Figure 12:
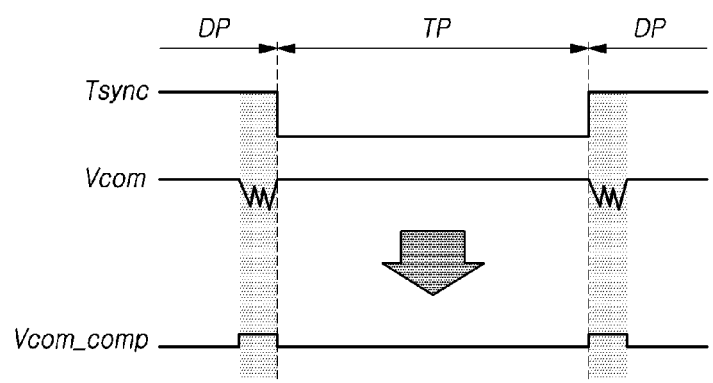
FIG. 12 illustrates a signal waveform showing an example of a compensated common voltage supplied in a transition period between a display driving period and a touch driving period in the touch display device according to embodiments of the present disclosure.

FIG. 12 illustrates a signal waveform showing an example of a compensated common voltage supplied in a transition period between a display driving period and a touch driving period in the touch display device according to embodiments of the present disclosure.

Referring to FIG. 12, the operation of the gate driving circuit in the touch display device 100 according to embodiments of the present disclosure may be temporarily stopped in the process of entering the touch driving period TP from the display driving period DP. Then, the operation of the gate driving circuit may be restarted at starting point of the display driving period DP after the touch driving period TP ends.

Accordingly, a distortion of the common voltage Vcom may occur in some gate lines in a period which the gate driving circuit operates discontinuously. Therefore, it may cause defects such as horizontal lines by a luminance difference.

In order to counterbalance the distortion of the common voltage Vcom, a compensated common voltage Vcom_comp corresponding to the distortion waveform of the common voltage Vcom may be supplied according to the supplying time of the common voltage Vcom.

In this case, the compensated common voltage Vcom_comp supplied in the transition period between the display driving period DP and the touch driving period TP may be pulse signal having a plurality of levels in the case of overlap distortion, but may be single-level signal having a constant level in the case of transition distortion.

This is because the transition distortion caused by the transition operation between the display driving period DP and the touch driving period TP may cause a simple distortion of the common voltage Vcom different from the overlap distortion occurring in a period which the plurality of scan signals SCAN are overlapped.

Nevertheless, the pulse width and level of the compensated common voltage Vcom_comp supplied in the transition period between the display driving period DP and the touch driving period TP may be changed according to the shape of the touch electrodes TE.

For example, in the case of the split type touch electrodes TE, the transition period between the display driving period DP and the touch driving period TP may occur in a central portion of the touch electrodes TE or may occur in an edge portion of the touch electrodes TE since a plurality of gate lines are disposed on one touch electrode TE. However, since the split type touch electrodes have the same size, the waveform of the compensated common voltage Vcom_comp to be supplied to the touch electrodes TE may be determined in consideration of the average value of the distorted common voltage.

On the other hand, as described above, since the length of the long touch electrodes are different from the short touch electrodes in the woven type touch electrodes TE, the distortion waveform of the common voltage Vcom may be different in the long touch electrodes and the short touch electrodes. Accordingly, the compensated common voltage Vcom_comp supplied to the long touch electrodes and the short touch electrodes in the transition period may have different widths and sizes.

Here, it illustrates an exemplary case that the compensated common voltage Vcom_comp is supplied during the display driving period DP before entering the touch driving period TP and during the display driving period DP after the touch driving period TP ends. However, the compensated common voltage Vcom_comp may be supplied during the touch driving period TP after entering the touch driving period TP or during the transition period between the display driving period DP and the touch driving period TP.

In addition, the touch display device 100 of the present disclosure may include a common voltage compensation line for supplying the compensated common voltage Vcom_comp to the touch electrodes TE in order to compensate for the distortion of the common voltage Vcom.

Figure 13:
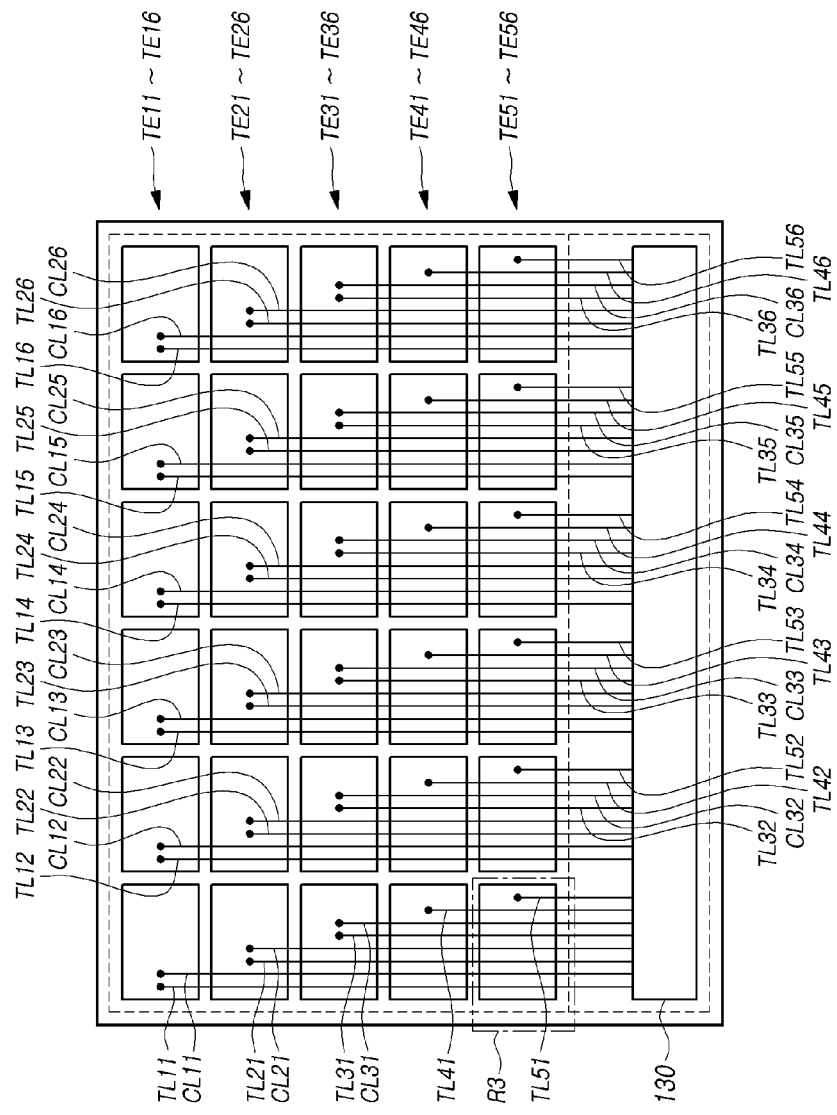
FIG. 13 illustrates an exemplary structure of touch electrodes including common voltage compensation lines in a touch display device according to embodiments of the present disclosure.

FIG. 13 illustrates an exemplary structure of touch electrodes including common voltage compensation lines in a touch display device according to embodiments of the present disclosure.

Referring to FIG. 13, the display panel 110 in the touch display device 100 according to embodiments of the present disclosure may include an active area in which an image is displayed and a non-active area in which an image is not displayed.

Touch electrodes TE may be arranged on the active area. The touch driving circuit 130 and various signal lines may be arranged on the non-active area outside the active area.

The active area may include a plurality of touch lines TL11-TL16, TL21-TL26, TL31-TL36, TL41-TL46, TL51-TL56 and a plurality of common voltage compensation lines CL11-CL16, CL21-CL26, CL31-CL36. The plurality of touch lines TL11-TL16, TL21-TL26, TL31-TL36, TL41-TL46, TL51-TL56 may be are connected to each of touch electrodes TE11-TE16, TE21-TE26, TE31-TE36, TE41-TE46, TE51-TE56 divided in a first direction (e.g., a horizontal direction) and a second direction (e.g., a vertical direction) crossing each other and may be arranged in parallel with each other in the second direction. The plurality of common voltage compensation lines CL11-CL16, CL21-

CL26, CL31-CL36 may be respectively connected to at least some of the touch electrodes TE11-TE16, TE21-TE26, TE31-TE36 of the touch electrodes TE11-TE16, TE21-TE26, TE31-TE36, TE41-TE46, TE51-TE56.

The plurality of common voltage compensation lines CL11-CL16, CL21-CL26, CL31-CL36 may be arranged in parallel with the touch lines TL11-TL16, TL21-TL26, TL31-TL36, TL41-TL46, TL51-TL56 to which touch driving signals or touch sensing signals are transmitted.

Here, the plurality of common voltage compensation lines CL11-CL16, CL21-CL26, CL31-CL36 correspond to signal lines to which the compensated common voltage Vcom_comp is supplied for counterbalancing the distortion of the common voltage generated by overlapping the scan signals or the distortion of the common voltage generated in the transition period. The plurality of common voltage compensation lines CL11-CL16, CL21-CL26, CL31-CL36 may be connected to all touch electrodes TE11-TE16, TE21-TE26, TE31-TE36, TE41-TE46, TE51-TE56 or to some touch electrodes TE11-TE16, TE21-TE26, TE31-TE36 in the display panel 110.

When the plurality of common voltage compensation lines CL11-CL16, CL21-CL26, CL31-CL36 are connected only to some of the touch electrodes among all the touch electrodes TE11-TE16, TE21-TE26, TE31-TE36, TE41-TE46, TE51-TE56 disposed on the display panel 110, they may be connected to some touch electrodes TE11-TE16, TE21-TE26, TE31-TE36 having a high load disposed at a location far from the touch driving circuit 130.

Meanwhile, in addition to the common voltage compensation lines CL11-CL16, CL21-CL26, CL31-CL36, a plurality of dummy compensation lines and dummy contact holes electrically connecting the dummy compensation lines in order to increase visibility may be further disposed in the display panel 110 including the plurality of touch electrodes TE11-TE16, TE21-TE26, TE31-TE36, TE41-TE46, TE51-TE56.

Figure 14:
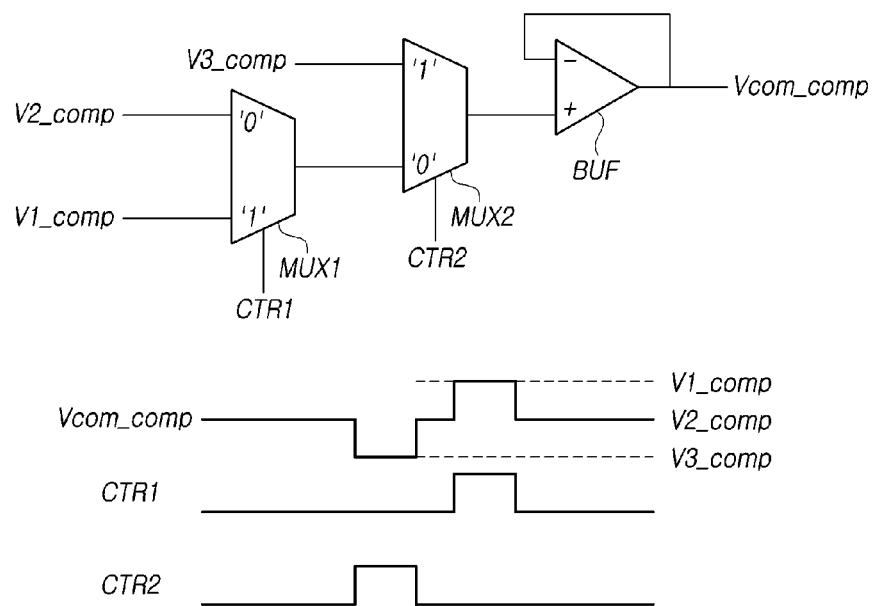
FIG. 14 illustrates an exemplary block diagram of a circuit for generating a compensated common voltage in a touch display device according to embodiments of the present disclosure.

FIG. 14 illustrates an exemplary block diagram of a circuit for generating a compensated common voltage in a touch display device according to embodiments of the present disclosure.

Referring to FIG. 14, a compensated common voltage generation circuit for generating the compensated common voltage Vcom_comp in the touch display device 100 according to embodiments of the present disclosure may be configured in a power management integrated circuit for supplying power or may be configured as a separate circuit.

The compensated common voltage generating circuit may include a first multiplexer MUX1, a second multiplexer MUX2, and a buffer circuit BUF. The first multiplexer MUX1 may receive the first level voltage V1_comp and the second level voltage V2_comp as inputs, and may select the first level voltage V1_comp or the second level voltage V2_comp as a first output signal according to a first control signal CTR1. The second multiplexer MUX2 may receive the first output signal of the first multiplexer MUX1 and a third level voltage V3_comp as inputs and may select a second output signal according to a second control signal CTR2. The buffer circuit BUF transfers the second output signal of the second multiplexer MUX2.

The first level voltage V1_comp may be a maximum level of the common voltage Vcom that is distorted in the overlapping period or transition period of scan signals. The second level voltage V2_comp may be an average level of the distorted common voltage Vcom. The third level voltage V3_comp may be a minimum level of the distorted common voltage Vcom.

At this time, the waveform of the compensated common voltage Vcom_comp generated from the buffer circuit BUF may be variously changed by controlling the waveforms of the first control signal CTR1 supplied to the first multiplexer MUX1 and the second control signal CTR2 supplied to the second multiplexer MUX2.

In this case, the buffer circuit BUF may be omitted from the compensated common voltage generating circuit.

Figure 15:
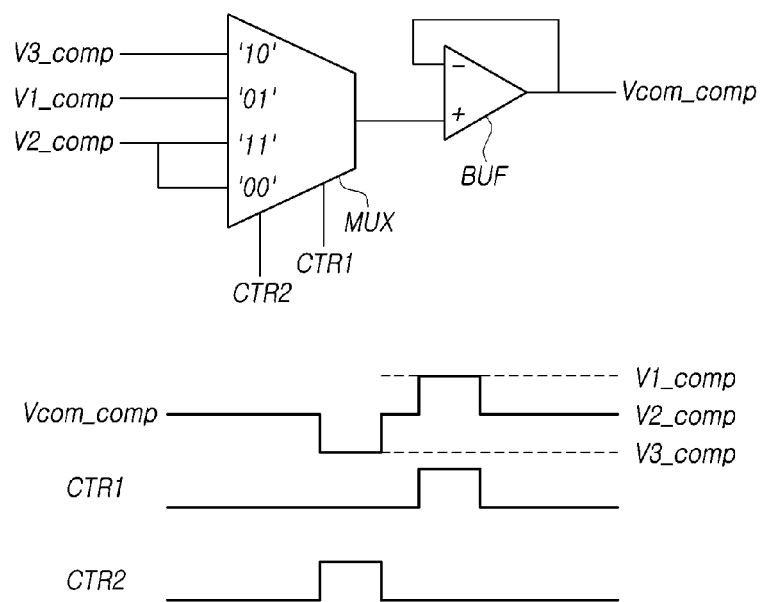
FIG. 15 illustrates another exemplary block diagram of a circuit for generating a compensated common voltage in a touch display device according to embodiments of the present disclosure.

FIG. 15 illustrates another exemplary block diagram of a circuit for generating a compensated common voltage in a touch display device according to embodiments of the present disclosure.

Referring to FIG. 15, the compensated common voltage generation circuit for generating the compensated common voltage Vcom_comp in the touch display device 100 according to embodiments of the present disclosure may include a multiplexer MUX and a buffer circuit BUF. The multiplexer MUX may receive the first level voltage V1_comp, the second level voltage V2_comp, and the third level voltage V3_comp as inputs, and may select an output signal by the first control signal CTR1 and the second control signal CTR2. The buffer circuit BUF transmits the output signal of the multiplexer MUX.

The first level voltage V1_comp may be one level among a plurality of voltage levels in a high level section greater than the average level of the distorted common voltage Vcom in the overlapping period or transition period of scan signals. The second level voltage V2_comp may be an average level of the distorted common voltage Vcom. The third level voltage V3_comp may be one level among a plurality of voltage levels in a low level section less than the average level of the distorted common voltage Vcom.

Accordingly, the waveform of the compensated common voltage Vcom_comp generated from the buffer circuit BUF may be variously changed by controlling the waveforms of the first control signal CTR1 and the second control signal CTR2 supplied to the multiplexer MUX.

In this case, the buffer circuit BUF may be omitted from the compensated common voltage generating circuit.

As described above, the touch display device 100 of the present disclosure may counterbalance the distortion of the common voltage and improve the image quality by generating the compensated common voltage with a different waveform according to the structure of the touch electrodes and supplying it to the corresponding touch electrodes through the common voltage compensation lines in order to counterbalance the distortion of the common voltage during the overlapping period of the scan signals or the transition period between the display driving period and the touch driving period.

The above description has been presented to enable any person skilled in the art to make and use the technical idea of the present invention, and has been provided in the context of a particular application and its requirements. Various modifications, additions and substitutions to the described embodiments will be readily apparent to those skilled in the art, and the general principles defined herein may be applied to other embodiments and applications without departing from the spirit and scope of the present invention. The above description and the accompanying drawings provide an example of the technical idea of the present invention for illustrative purposes only. That is, the disclosed embodiments are intended to illustrate the scope of the technical idea of the present invention. Thus, the scope of the present invention is not limited to the embodiments shown, but is to be accorded the widest scope consistent with the claims. The scope of protection of the present invention should be construed based on the following claims, and all technical ideas within the scope of equivalents thereof should be construed as being included within the scope of the present invention.

What is claimed is:

1. A touch display device comprising:
a display panel including a plurality of touch electrodes;
a display driving circuit configured to supply scan signals to the display panel through a plurality of gate lines; and
a touch driving circuit configured to perform a touch sensing operation according to capacitance variations of the plurality of touch electrodes, and supply at least one compensated common voltage with a waveform for counterbalancing at least one distorted common voltage based upon structures and shapes of the plurality of touch electrodes to the plurality of the touch electrodes according to time of the at least one distorted common voltage transmitted through a plurality of touch lines in order to reduce a distortion of a common voltage during an overlapping period where adjacent scan signals are overlapped in a display driving period.

2. The touch display device according to claim 1, wherein the plurality of touch electrodes are split type touch electrodes having a same horizontal length and a same vertical length.

3. The touch display device according to claim 1, wherein the plurality of touch electrodes are woven type touch electrodes in which a plurality of first touch electrodes with a first length and a plurality of second touch electrodes with a second length that is less than the first length in a first direction are alternately arranged in a second direction, and the plurality of second touch electrodes arranged in the second direction are connected to a same touch line.

4. The touch display device according to claim 3, wherein each of the plurality of first touch electrodes is connected to a corresponding one touch line.

5. The touch display device according to claim 3, wherein the at least one compensated common voltage has a different waveform supplied to the plurality of first touch electrodes and the plurality of second touch electrodes.

6. The touch display device according to claim 1, wherein the at least one compensated common voltage comprises pulse signals with a first level among a plurality of voltage levels in a high level section that is greater than an average level of the distorted common voltage, a second level corresponding to the average level of the distorted common voltage, and a third level among a plurality of voltage levels in a low level section that is less than the average level of the distorted common voltage to counterbalance the distortion of the common voltage during the overlapping period of the scan signals.

7. The touch display device according to claim 1, wherein the at least one compensated common voltage comprises single-level signals with a constant level to counterbalance the distortion of the common voltage during a transition period between a display driving period and a touch driving period.

8. The touch display device according to claim 7, wherein the at least one compensated common voltage is supplied during the display driving period before entering the touch driving period, and during the display driving period after the touch driving period ends.

9. The touch display device according to claim 1, further comprising:
a compensated common voltage generation circuit including:
a first multiplexer configured to receive a first level voltage and a second level voltage as input signals, and select a first output signal according to a first control signal;
a second multiplexer configured to receive the first output signal of the first multiplexer and a third level voltage as input signals and select a second output signal according to a second control signal; and
a buffer circuit configured to receive the second output signal of the second multiplexer and transmit the at least one compensated common voltage.

10. The touch display device according to claim 1, further comprising:
a compensated common voltage generation circuit including:
a multiplexer configured to receive a first level voltage, a second level voltage, and a third level voltage as input signals, and select an output signal by a first control signal and a second control signal; and
a buffer circuit configured to receive the output signal of the multiplexer and transmit the at least one compensated common voltage.

11. The touch display device according to claim 1, further comprising:
a plurality of common voltage compensation lines arranged in parallel with a plurality of touch lines transmitting touch signals to the plurality of touch electrodes, and configured to supply the at least one compensated common voltage to the plurality of touch electrodes.

12. A touch driving circuit comprising:
a plurality of touch lines configured to transmit touch driving signals to a display panel including a plurality of touch electrodes;
a touch sensing circuit configured to supply the touch driving signals to the plurality of touch electrodes through the plurality of touch lines and receive touch sensing signals from the plurality of touch electrodes;
a touch controller configured to detect touch presence according to the touch sensing signals and calculate touch coordinates; and
a compensated common voltage generation circuit configured to generate at least one compensated common voltage with a waveform for counterbalancing at least one distorted common voltage supplied to the plurality of the touch electrodes according to time of the at least one distorted common voltage transmitted through the plurality of touch lines based upon structures and shapes of the plurality of touch electrodes for counterbalancing the at least one distorted common voltage during an overlapping period where adjacent scan signals are overlapped in a display driving period.

13. The touch driving circuit according to claim 12, wherein the at least one compensated common voltage has a different waveform supplied to the plurality of first touch electrodes and the plurality of second touch electrodes.

14. The touch driving circuit according to claim 12, wherein the at least one compensated common voltage comprises pulse signals with a first level among a plurality of voltage levels in a high level section that is greater than an average level of the distorted common voltage, a second level corresponding to the average level of the distorted common voltage, and a third level among a plurality of voltage levels in a low level section that is less than the average level of the distorted common voltage during the overlapping period.

15. The touch driving circuit according to claim 12, wherein the at least one compensated common voltage comprises single-level signals with a constant level to counterbalance the at least one distorted common voltage during a transition period between the display driving period and a touch driving period.

16. The touch driving circuit according to claim 15, wherein the at least one of compensated common voltages are supplied during the display driving period before entering the touch driving period, and during the display driving period after the touch driving period ends.

17. The touch driving circuit according to claim 12, wherein the compensated common voltage generation circuit includes:
a first multiplexer configured to receive a first level voltage and a second level voltage as input signals, and select a first output signal according to a first control signal;
a second multiplexer configured to receive the first output signal of the first multiplexer and a third level voltage as input signals and select a second output signal according to a second control signal; and
a buffer circuit configured to receive the second output signal of the second multiplexer and transmit the at least one compensated common voltage.

18. The touch driving circuit according to claim 12, wherein the compensated common voltage generation circuit includes:
a multiplexer configured to receive a first level voltage, a second level voltage, and a third level voltage as input signals, and select an output signal by a first control signal and a second control signal; and
a buffer circuit configured to receive the output signal of the multiplexer and transmit the at least one of compensated common voltages.

19. The touch driving circuit according to claim 12, further comprising:
a plurality of common voltage compensation lines arranged in parallel with the plurality of touch lines, the plurality of common voltage compensation lines configured to supply the at least one compensated common voltage to the plurality of touch electrodes.

20. A touch driving method for a touch display device including a display driving circuit configured to supply scan signals to a display panel with a plurality of touch electrodes, and a touch driving circuit configured to supply touch driving signals to the display panel and sense touches based on touch sensing signals received in response to the touch driving signals, the touch driving method comprising:
detecting an overlap distortion of a common voltage during an overlapping period which adjacent scan signals are overlapped in a display driving period;
generating at least one compensated common voltage for counterbalancing at least one of the overlap distortion of the common voltage according to structures and shapes of the plurality of touch electrodes; and
supplying the at least one compensated common voltage to the plurality of touch electrodes according to time of the at least one distorted common voltage transmitted through a plurality of touch lines during the overlapping period where adjacent scan signals are overlapped in a display driving period.

21. The touch driving method according to claim 20, wherein the at least one compensated common voltage has a different waveform supplied to the plurality of first touch electrodes and the plurality of second touch electrodes.

22. The touch driving method according to claim 20, wherein the at least one compensated common voltage comprises pulse signals with a first level among a plurality of voltage levels in a high level section that is greater than an average level of the distorted common voltage, a second level corresponding to the average level of the distorted common voltage, and a third level among a plurality of voltage levels in a low level section that is less than the average level of the distorted common voltage during the overlapping period.

23. The touch driving method according to claim 20, wherein the at least one of compensated common voltages comprises single-level signals with a constant level to counterbalance the distortion of the common voltage during a transition period between the display driving period and a touch driving period.

24. The touch driving method according to claim 23, wherein the at least one compensated common voltage us supplied during the display driving period before entering the touch driving period, and during the display driving period after the touch driving period ends.

* * * * *